United States Patent [19]
Harvey

[11] Patent Number: 6,084,305
[45] Date of Patent: *Jul. 4, 2000

[54] SHAPED ETCH-FRONT FOR SELF-ALIGNED CONTACT

[75] Inventor: Ian Robert Harvey, Livermore, Calif.

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/944,463

[22] Filed: Oct. 6, 1997

[51] Int. Cl.$^7$ .................................................. H01L 23/48
[52] U.S. Cl. ........................... 257/774; 257/635; 257/649
[58] Field of Search ................................. 257/635, 640, 257/644, 649, 774

[56] References Cited

U.S. PATENT DOCUMENTS

| | | | |
|---|---|---|---|
| Re. 33,622 | 6/1991 | Lee et al. ................................. | 156/643 |
| 4,342,617 | 8/1982 | Fu et al. .................................. | 156/643 |
| 4,807,016 | 2/1989 | Douglas .................................. | 357/67 |
| 4,814,041 | 3/1989 | Auda ....................................... | 156/643 |
| 5,562,801 | 10/1996 | Nulty ...................................... | 156/643.1 |
| 5,883,436 | 3/1999 | Sadjadi et al. .......................... | 257/760 |

*Primary Examiner*—Carl Whitehead, Jr.
*Assistant Examiner*—Roy Potter
*Attorney, Agent, or Firm*—Wagner, Murabito & Hao LLP

[57] ABSTRACT

A semiconductor device structure and method for producing a shaped etch-front during an etching process. In one embodiment, the present invention is comprised of a first layer of material which is disposed above a contact layer. In this embodiment, the first layer of material has a first etch rate. Next, the present invention deposits a second layer of material above at least a portion of the first layer of material. The second layer of material has a second etch rate which is faster than the first etch rate. Additionally, in the present invention, the first layer of material and the second layer of material have a sloped interfacial topography. The sloped interfacial topography of the present invention creates shaped etch-front during the etching of an opening extending through the first layer of material and the second layer of material. In so doing, the present invention enhances process margin by preventing unwanted etching of portions of the semiconductor device structure during the etching of the opening.

16 Claims, 7 Drawing Sheets

SHAPED ETCH-FRONT FOR SELF-ALIGNED CONTACT

TECHNICAL FIELD

The present claimed invention relates to the field of semiconductor devices. More specifically, the present claimed invention relates to the formation of semiconductor devices.

BACKGROUND ART

During the formation of semiconductor devices, it is often necessary to electrically couple layers which are vertically arranged. That is, it is often necessary to electrically couple features on one layer to features on an underlying or an overlying layer. In order to accomplish such a task, an opening is typically formed extending through the vertically arranged layers. The contact opening is then filled with a conductive material so as to form a conductive path extending between the vertically arranged layers.

Prior Art FIG. 1A shows a side sectional view of a conventional semiconductor device structure 100. In Prior Art FIG. 1A, a substrate, not shown, has a polysilicon gate structure 102 formed thereover. Lightly doped drain (LDD) spacer oxide structures, typically shown as 104a and 104b are disposed on the sides of polysilicon gate structure 102. The conventional structure of Prior Art FIG. 1A further includes a nitride layer 106 which is disposed thereover.

Referring still to Prior Art FIG. 1A, a high density plasma (HDP) deposited oxide layer 108 is disposed overlying nitride layer 106. Next, a cap oxide layer 110 formed, for example, of silicon dioxide is disposed over HDP layer 108. In Prior Art FIG. 1A, semiconductor device structure 100 is shown after a planarization process has been performed to provide a smoothly planarized top surface.

Referring next to Prior Art FIG. 1B, an opening 112 is shown formed extending through portions of cap oxide layer 110 and underlying HDP layer 108. As shown in Prior Art FIG. 1B, the bottom portion or "etch-front" of opening 112 is substantially flat (i.e. horizontally oriented and parallel to the top surface of semiconductor device structure 100). The etch-front can be thought of as the patterned oxide surface which is undergoing ion bombardment and reactive etching during the progression of the etch. During the formation and location of opening 112, misalignments frequently occur. That is, instead of locating and forming opening 112 directly over a source or drain region, a portion of opening 112 can be formed overlying LDD spacer oxide 104b, as shown in Prior Art FIG. 1B. When such a misalignment occurs, an edge/corner of the etch-front of opening 112 can contact nitride layer 106 overlying LDD spacer oxide 104b.

Referring now to Prior Art FIG. 1C, another example of a misaligned opening 112 is shown. In the example of Prior Art Fig. 1C, instead of locating and forming opening 112 directly over polysilicon gate structure 102 as desired, a portion of opening 112 is shown inadvertently formed overlying LDD spacer oxide 104a. When such a misalignment occurs, an edge/corner 116 of the etch-front of opening 112 can contact nitride layer 106 overlying LDD spacer oxide 104a.

Referring again to Prior Art FIG. 1B, due to the above-described misalignment (i.e. edge 114 of the etch-front of opening 112 overlying LDD spacer oxide 104b), nitride layer 106 may be deleteriously etched during the formation of opening 112. That is, even though it intended to etch only through cap oxide layer 110 and HDP oxide layer 108 and stop at the portion of nitride layer 106 overlying the source/drain region, conventional contact opening formation methods may result in unwanted etching of nitride layer 106 overlying the LDD spacer oxide. This problem associated with the prior art is further exacerbated by the fact that nitride layer 106 is deposited nonconformally over LDD spacer oxide 106. Thus, the portion of nitride layer 106 residing along the edge of LDD spacer oxide 104b is typically thinner than the portion of nitride layer 106 residing above the source/drain region. Additionally, during the timed progression of the etch, the etch-front of opening 112 reaches the sloped edge along the side of LDD spacer oxide 104b before the etch-front reaches the portion of nitride layer 106 overlying the source/drain region. As a result, the nitride along the edge of LDD spacer oxide 104b is potentially subjected to a longer etch time than is the portion of nitride layer 106 overlying the source/drain region. As yet another substantial drawback, sputtering efficiency is greater when the surface being etched is at some angle other than normal to the impinging ions, with peak efficiency occurring at 45 degrees. Therefore, the portion of nitride layer 106 residing along the edge of LDD spacer oxide 104b etches much faster than would any portion of the nitride layer which is parallel to the etch-front of opening 112 (e.g. the portion of nitride layer 106 residing above the source/drain region).

With reference now to Prior Art FIG. 1D, a deleterious condition associated with the misalignment of Prior Art FIG. 1B is shown. Specifically, for the reasons mentioned above, a portion of nitride layer 106 residing along the edge of LDD spacer oxide 104b has been etched away. As a result, the LDD spacer oxide 104b has also been etched and severely compromised. Thus, in such prior art methods, instead of forming an opening extending through cap oxide layer 110 and HDP oxide layer 108 to the top surface of nitride layer 106 above the source/drain region as intended, it is possible that the LDD spacer oxide 104b is damaged.

The preceding discussion specifically describes defects associated with a misalignment occurring when attempting to form opening 112 over a source/drain region. It will be understood, however, that similar defects are associated with a misalignment occurring when attempting to form opening 112 over a polysilicon gate structure (see e.g. Prior Art FIG. 1C).

Thus, a need exists for a semiconductor device structure which enhances process margin by preventing unwanted etching of various features during the formation of a contact opening. A further need exists for a semiconductor device structure which meets the above need without requiring substantial deviation from existing semiconductor manufacturing steps and processes.

DISCLOSURE OF THE INVENTION

The present invention provides a semiconductor device structure which enhances process margin by preventing unwanted etching of various features during the formation of a contact opening. The present invention further provides a semiconductor device structure which meets the above need without requiring substantial deviation from existing semiconductor manufacturing steps and processes.

Specifically, in one embodiment, the present invention is comprised of a first layer of material which is disposed above a contact layer. In this embodiment, the first layer of material has a first etch rate. Next, the present invention deposits a second layer of material above at least a portion of the first layer of material. The second layer of material has a second etch rate which is faster than the first etch rate. Additionally, in the present invention, the first layer of material and the second layer of material have a sloped interfacial topography. The sloped interfacial topography of the present invention creates shaped etch-front during the etching of an opening extending through the first layer of material and the second layer of material. In so doing, the present invention enhances process margin by preventing unwanted etching of portions of the semiconductor device structure during the etching of the opening.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

Prior Art

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
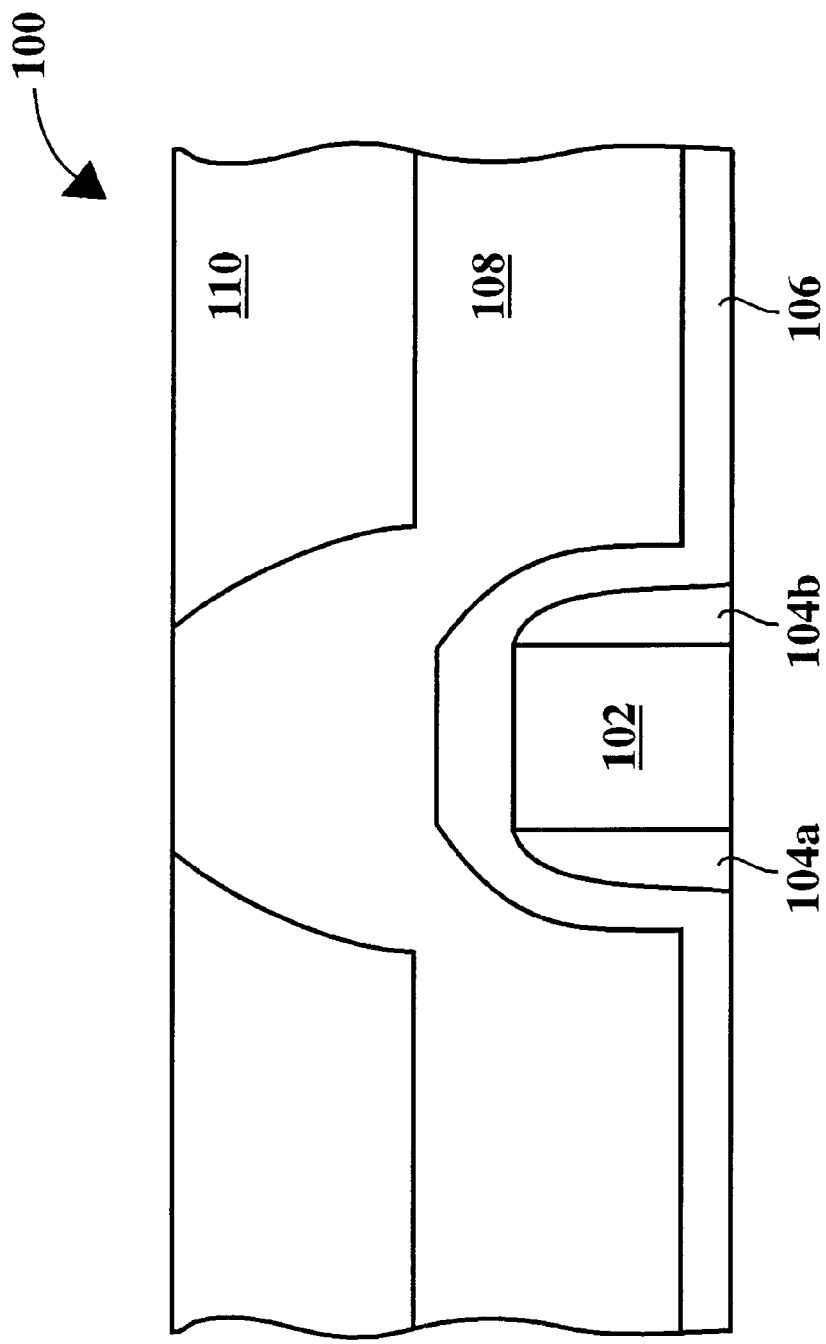
FIG. 1A is cross-sectional view of a conventional semiconductor device structure.
Figure 1B:
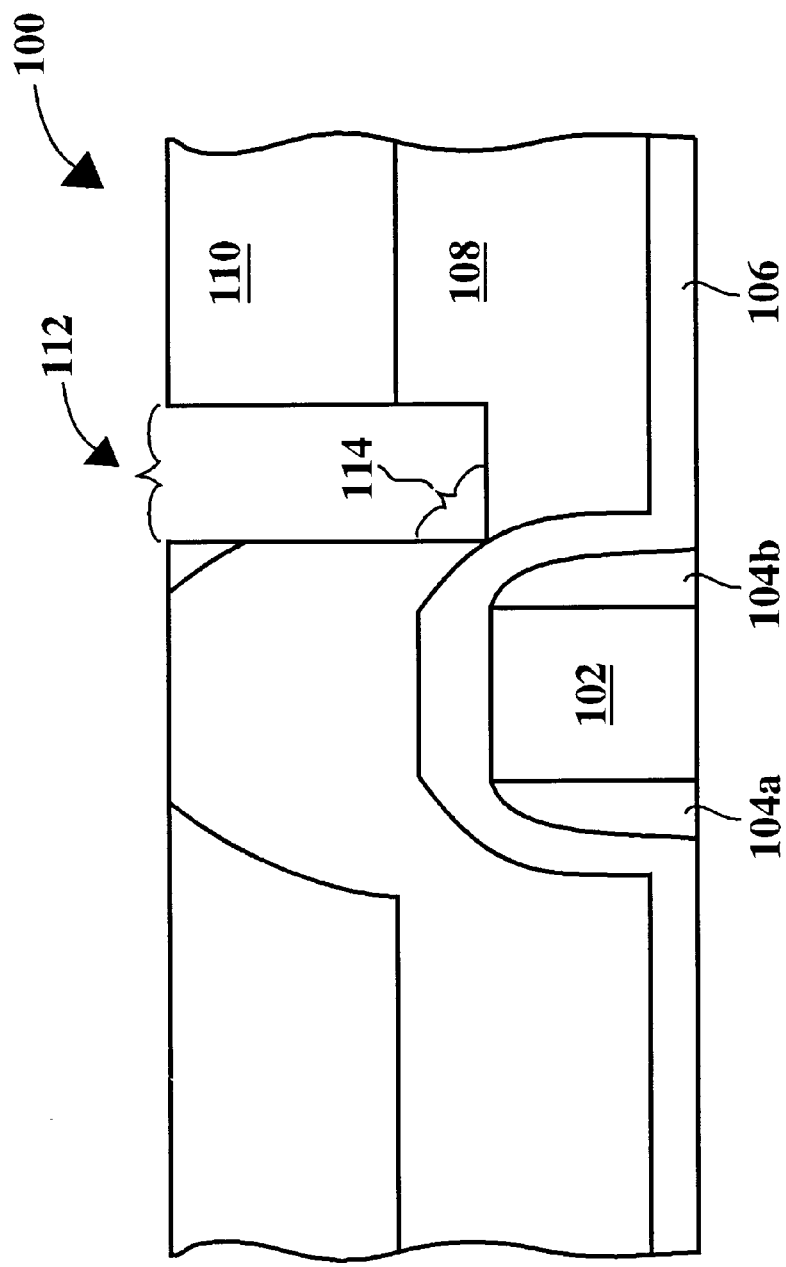
FIG. 1B is a cross-sectional view illustrating the conventional semiconductor device structure of Prior Art FIG. 1A having a portion of an misaligned opening formed therein.
Figure 1C:
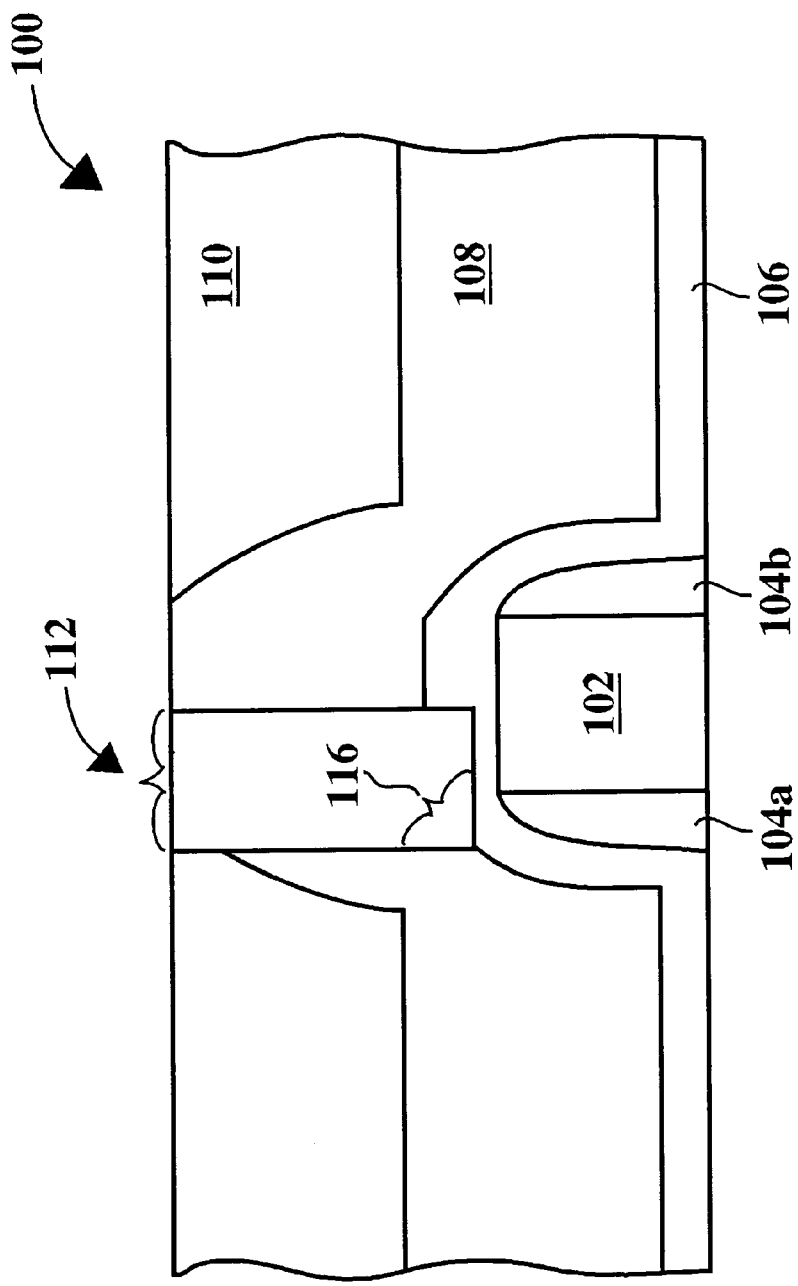
FIG. 1C is a cross-sectional view illustrating the conventional semiconductor device structure of Prior Art FIG. 1A having a portion of another misaligned opening formed therein.
Figure 1D:
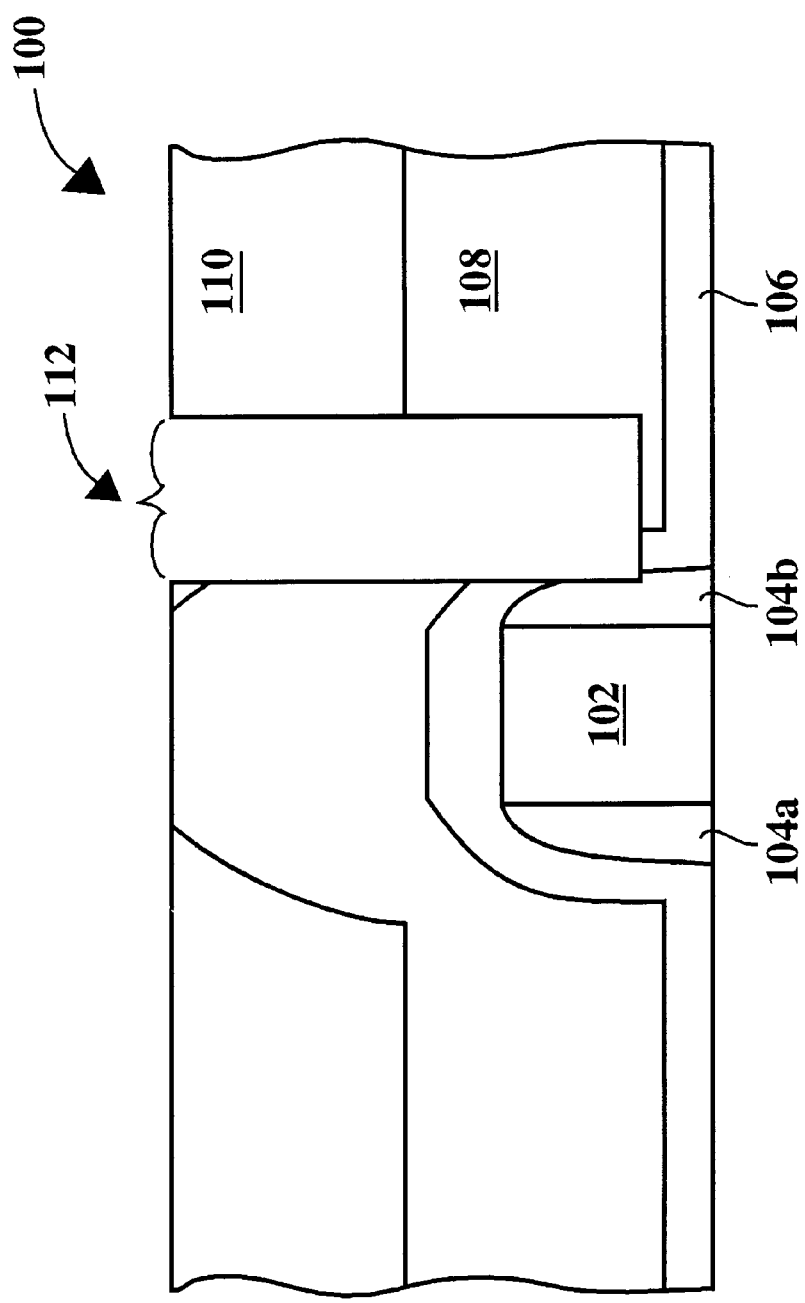
FIG. 1D is a cross-sectional view illustrating the conventional semiconductor device structure of Prior Art FIG. 1A having a larger portion of the misaligned opening formed therein.
Figure 2A:
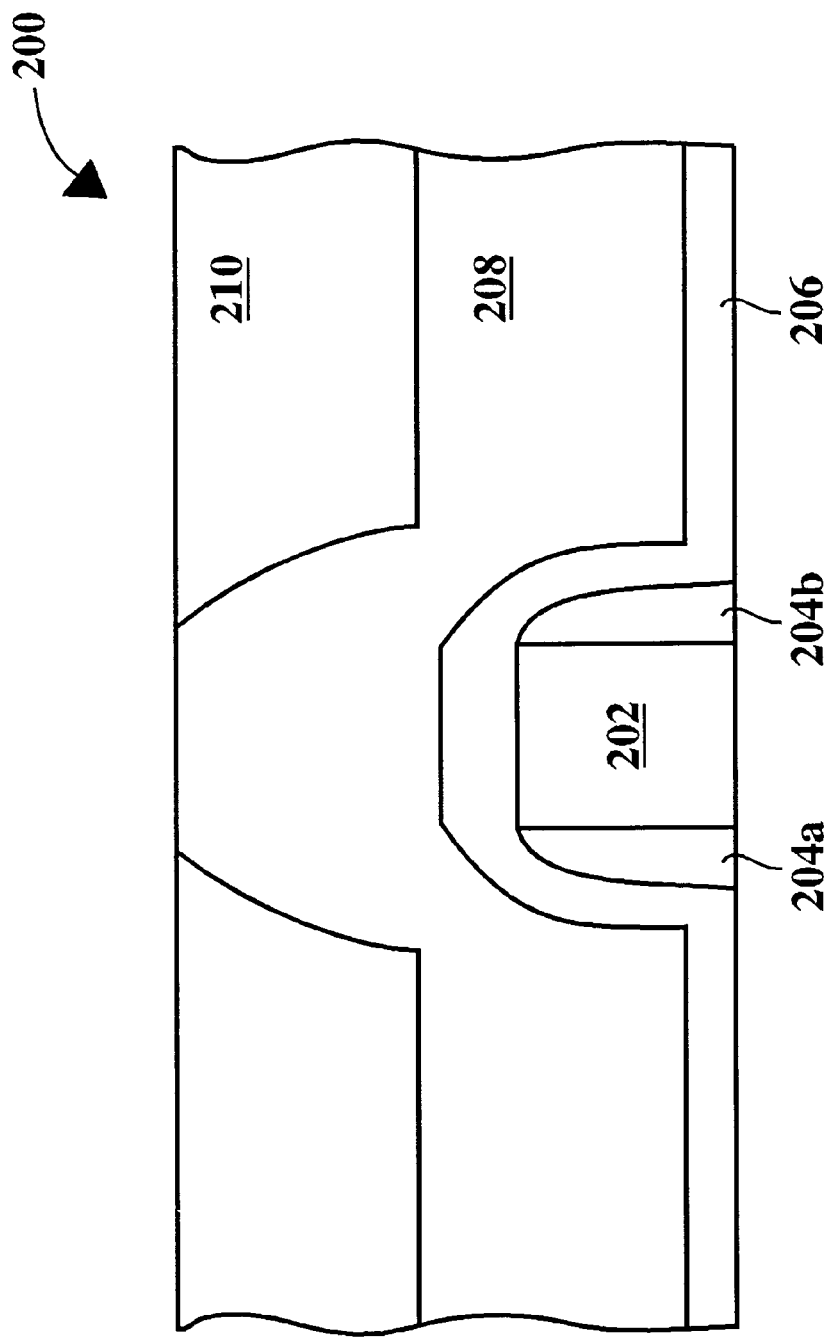
FIG. 2A is cross-sectional view of a semiconductor device structure in accordance with the present claimed invention.

The following discussion will pertain to cross-sectional views of a semiconductor device structure 200. With reference now to FIG. 2A, a substrate, not shown, has a polysilicon gate structure 202 formed thereover. Lightly doped drain (LDD) spacer oxide structures, typically shown as 204a and 204b are disposed on the sides of polysilicon gate structure 202. Structure 200 of FIG. 2 further includes a nitride layer 206 which is disposed thereover. In the present embodiment, nitride layer 206 is comprised, for example, of silicon nitride having any of various stoichiometries (e.g. $Si_xN_y$). Nitride layer 206 is adapted to be disposed over, for example, a metal silicide which, in turn, is disposed over, for example, polysilicon gate structure 202, or the source/drain region of semiconductor device structure 200.

Referring still to FIG. 2A, a high density plasma (HDP) deposited oxide layer 208 is disposed overlying nitride layer 206. Next, a cap oxide layer 210 is disposed over HDP layer 208. In the present invention, a sloped interfacial topography exists between HDP layer 208 and cap oxide layer 210. Additionally, in the present invention, the material comprising HDP layer 208 is selected to a have a first etch rate. Furthermore, the material comprising cap oxide layer 210 is selected to have a second etch rate which is faster than the first etch rate. That is, in the present invention, under specific oxide etching conditions, cap oxide layer 210 will etch at rate which is faster than the rate at which HDP oxide layer 208 will etch. Moreover, in the present embodiment, the material comprising cap oxide layer 210 has a etch rate which is approximately at least 5 times greater than the etch rate of HDP oxide layer 208. In the embodiment of FIG. 2A, semiconductor device structure 200 of the present invention is shown after a planarization process has been performed to provide a smoothly planarized top surface.

With reference still to FIG. 2A, in the present embodiment, HDP oxide layer 208 is comprised of, for example, silicon dioxide. In this embodiment, cap oxide layer is comprised of an approximately 6 percent-doped borophosphosilicate glass material. The present invention is, however, well suited to using various other highly-doped borophosphosilicate glass materials, various other spin-on-glass materials, and the like for cap oxide layer 210. Although such an HDP oxide layer and cap oxide layer are recited as overlying nitride layer 206 in the present embodiment, it will be understood that the present invention is well suited to use with various other types of HDP and cap oxide materials.

Figure 2B:
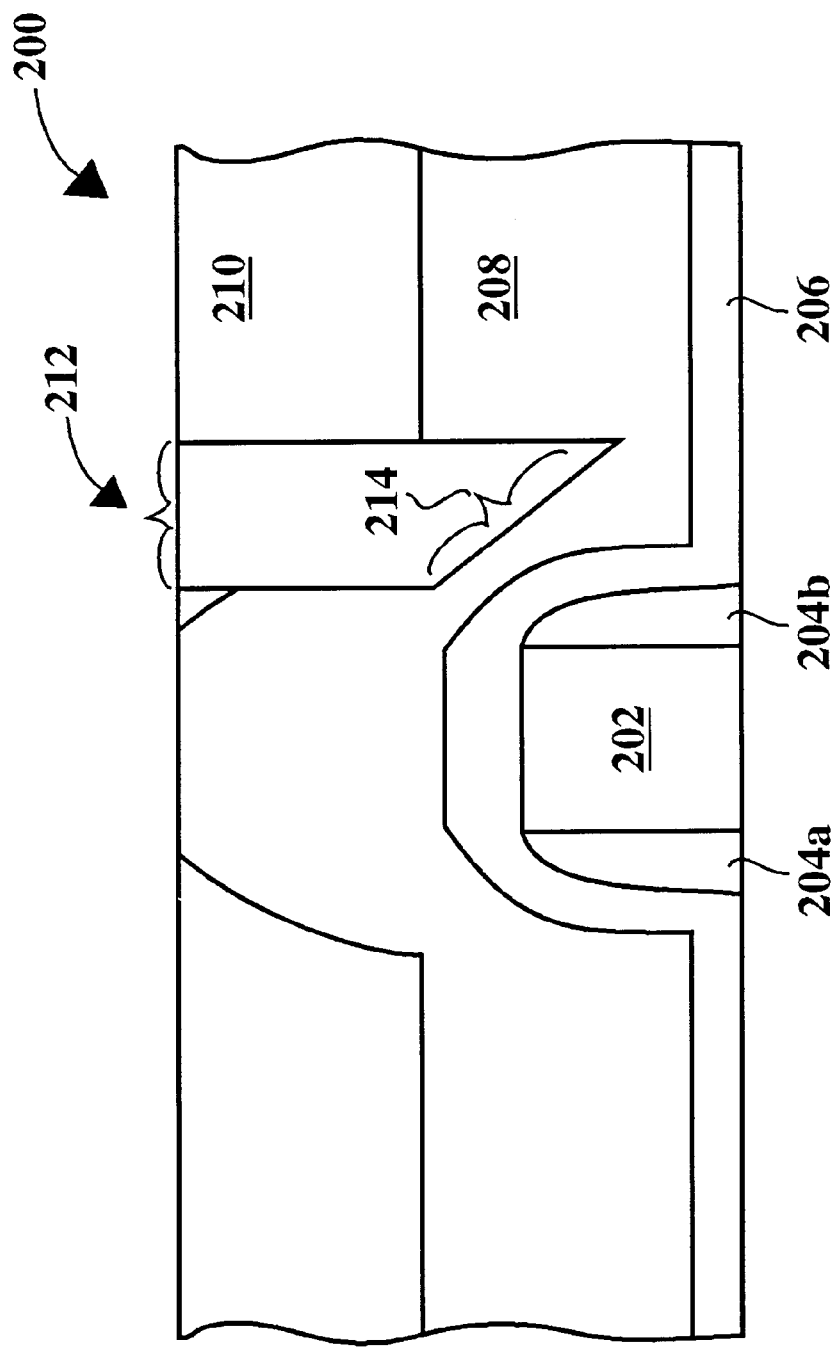
FIG. 2B is a cross-sectional view illustrating an opening formed through a portion of the semiconductor device structure of FIG. 2A wherein the opening has a shaped etch-front in accordance with the present claimed invention.

Referring now to FIG. 2B, as mentioned above, the present invention creates a sloped interfacial topography between cap oxide layer 210 and HDP layer 208, and selects a cap oxide material having an etch rate which is greater than the etch rate of the underlying HDP oxide layer. As a result, the present invention is able to generate an opening 212 (i.e. create the initial portion of a contact opening) having a sloped etch-front 214. More specifically, during the initial formation of opening 212, only the material comprising cap oxide layer 210 is being etched. However, as the etching process continues, the etch front of opening 212 reaches the interface of cap oxide layer 210 and HDP oxide layer 208. At such a time, both the material comprising cap oxide layer 210 and the material comprising HDP oxide layer 208 are being etched. Due to the sloped interfacial topography, and the aforementioned difference in etch rates, the etch front 214 of opening 212 is "shaped" (i.e. sloped).

As shown in FIG. 2B, in the present invention, etch-front 214 maintains its sloped shape even as it progresses through HDP oxide layer 208. As a result, the present invention eliminates many of the problems associated with prior art contact opening formation methods. For example, in the present invention, due to its sloped shape, etch-front 214 of opening is "delayed" in reaching the sloped edge along the side of LDD spacer oxide 204b. Therefore, unlike prior art methods, the portion of nitride layer 206 along the edge of LDD spacer oxide 204b is not subjected the substantially increased etch time compared to the portion of nitride layer 106 residing over the source/drain region of semiconductor device structure 200.

Referring still to FIG. 2B, it is desired to have contact opening extending through cap oxide layer 210 and HDP oxide layer 208, and then stop at the top surface of nitride layer 206. That is, it is desired to etch through the "oxide" layers 210 and 208 and not etch nitride layers 206. In order to achieve this goal, in the present embodiment, an etching environment/etch chemistry is selected which etches through the oxide layers without substantially etching nitride or photoresist. That is, in the present embodiment, the initial opening is formed through oxide layer 202 using an oxide selective etch. In the present embodiment, the present invention achieves an oxide-to-nitride selectivity of approximately 100 to 1. More specifically, the present invention utilizes a gas chemistry comprising approximately 300 standard cubic centimeters per minute (sccm) of Ar, approximately 2 sccm of $CF_4$, approximately 150 sccm of CO, and approximately 2 sccm of $C_4F_8$. Although such specific gas flow rates and ratios are recited in the present embodiment, the present invention is well suited to varying these flow rates/ratios as long as the oxide selective conditions of the present invention remain in effect. Additionally, in the present etch environment, cap oxide layer 210 will etch at rate which is faster than the rate at which HDP oxide layer 208 will etch.

Referring still to FIG. 2B, in the present embodiment, the etch environment has wafer area pressure of approximately 200 mTorr, a chamber pressure of approximately 60 mTorr, a top electrode power of approximately 800 Watts (@27 MHz), a bottom electrode power of approximately 1000 Watts (@2 MHz), a top electrode temperature of approximately 40 degrees Celsius, a bottom electrode temperature of approximately 40 degrees Celsius, and a wafer-to-top electrode gap of approximately 1.33 centimeters. Although such specific etching environment parameters are recited in the present embodiment, the present invention is well suited to varying these parameters as long as the oxide selective conditions of the present invention remain in effect, and as long as cap oxide layer 210 will etch at rate which is faster than the rate at which HDP oxide layer 208 will etch.

Figure 2C:
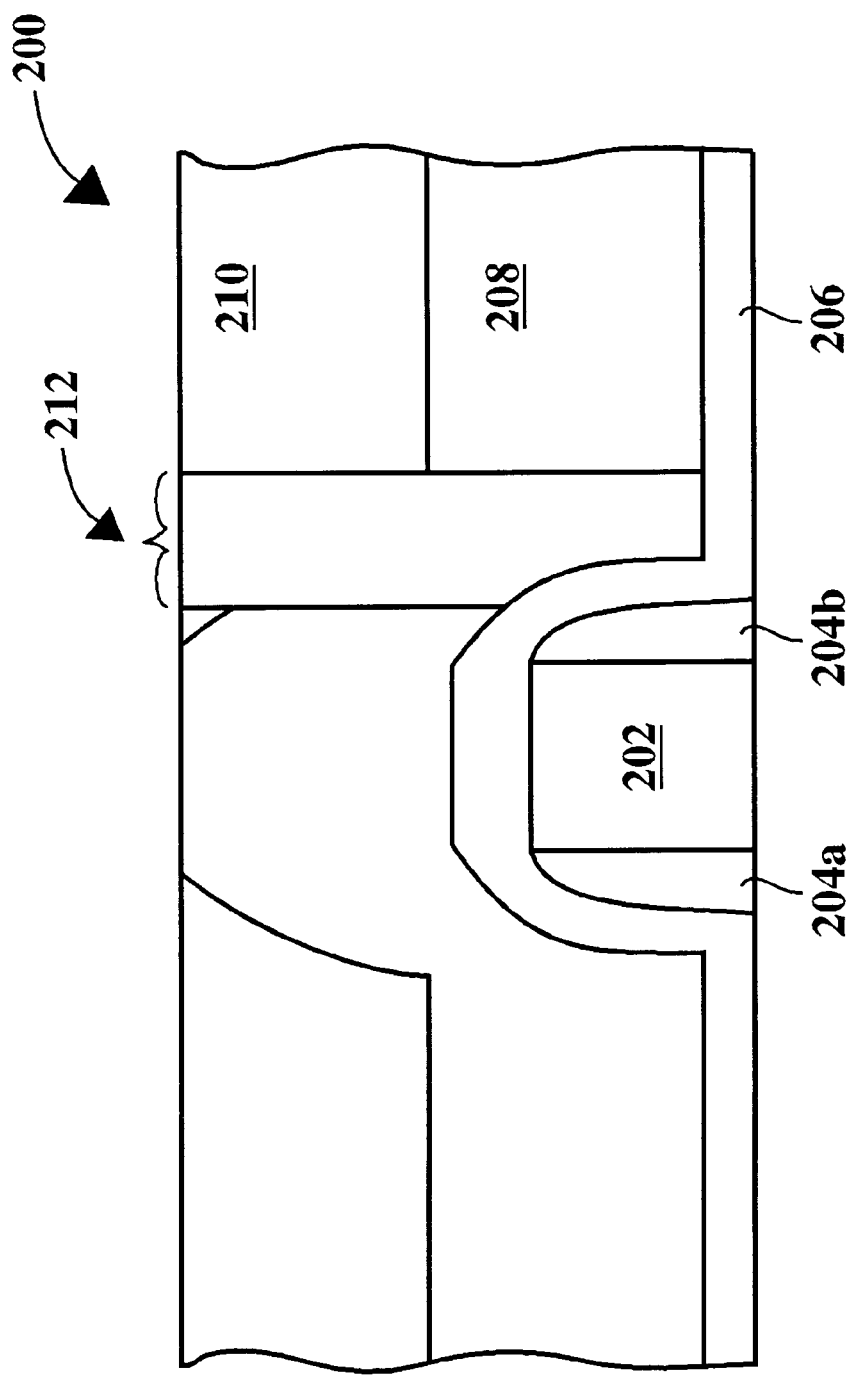
FIG. 2C is a cross-sectional view illustrating a misaligned opening formed completely through a portion of the semiconductor device structure of FIG. 2A in accordance with the present claimed invention.

With reference now to FIG. 2C, a side sectional view of semiconductor device structure 200 is shown with opening 212 extending through cap oxide layer 210 and HDP oxide layer 208 and stopping at the top surface of nitride layer 206. By generating the sloped etch-front 214 of FIG. 2B, opening 212 created in the present invention (unlike prior art contact openings) does not penetrate nitride layer 206 even along the sloped edges of LDD spacer oxide 204b. Thus, the present invention allows for the formation of a contact opening, even when a misalignment occurs in the location of the opening.

Although not shown in FIG. 2C, after the formation of the opening extending to the top surface of nitride layer 206, nitride layer 206 is etched away without substantially or detrimentally etching surrounding or underlying oxide regions. In so doing, opening 212 extends all the way to the desired contact layer. In the present embodiment, the contact layer is, for example, the source region, a silicided layer overlying the source region, the drain region, a silicided layer overlying the drain region, the polysilicon gate structure, a silicided layer overlying the polysilicon gate structure, and the like. In such an embodiment, the present invention achieves a nitride-to-oxide selectivity of approximately 7 to 1. More specifically, the present invention utilizes a gas chemistry comprising approximately 5 sccm of $CHF_3$, approximately 45 sccm of $O_2$, and approximately 10 sccm of He. Although such specific gas flow rates and ratios are recited in the present embodiment, the present invention is well suited to varying these flow rates/ratios as long as the nitride selective conditions of the present invention remain in effect.

In the above-mentioned embodiment, the nitride etch environment has wafer area pressure of approximately 200 mTorr, a chamber pressure of approximately 200 mTorr, a top electrode power of approximately 200 Watts, a bottom electrode power of approximately 100 Watts, a top electrode temperature of approximately 40 degrees Celsius, a bottom electrode temperature of approximately 40 degrees Celsius, and a wafer-to-top electrode gap of approximately 1.33 centimeters. Although such specific etching environment parameters are recited in the present embodiment, the present invention is well suited to varying these parameters as long as the nitride selective conditions of the present invention remain in effect.

The present invention provides a robust contact opening formation method and structure which enhances process margin. That is, unlike the prior art, the present invention is able to generate a contact opening, without deleteriously etching or damaging other features, even when the contact opening is misaligned from its intended location. Hence, the present invention eliminates defects associated with prior art contact opening formation methods and, thereby, improves yield in manufactured semiconductor devices. As yet another advantage, the present invention achieves the above accomplishments without substantially deviating from existing semiconductor manufacturing steps and processes.

Thus, the present invention provides a semiconductor device structure which enhances process margin by preventing unwanted etching of various features during the formation of a contact opening. The present invention further provides a semiconductor device structure which meets the above need without requiring substantial deviation from existing semiconductor manufacturing steps and processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor device structure for producing a shaped etch-front during an etching process and for preventing deleterious etching of a lightly doped drain spacer oxide and an overlying layer of material upon the etching of an opening wherein said opening at least partially overlies said lightly doped drain spacer oxide and said overlying layer of material, said semiconductor device structure comprising:

a first layer of material disposed above a contact layer, said first layer of material having a first etch rate; and a second layer of material disposed above at least a portion of said first layer of material, said second layer of material having a second etch rate which is faster than said first etch rate, said first layer of material and said second layer of material having a sloped interfacial topography such that a shaped etch-front is created during said etching of said opening through said first layer of material and said second layer of material, said shaped etch front resulting in an opening which does not induce deleterious etching of said lightly doped drain spacer oxide and said overlying layer of material residing at least partially along the bottom of said opening.

2. The semiconductor device structure of claim 1 further comprising:

a polysilicon gate structure disposed between said contact layer and said first layer of material.

3. The semiconductor device structure of claim 1 wherein said contact layer comprises the top surface of a polysilicon gate structure.

4. The semiconductor device structure of claim 1 wherein said contact layer overlies the top surface of a polysilicon gate structure.

5. The semiconductor device structure of claim 1 wherein said contact layer overlies the source region of a semiconductor device.

6. The semiconductor device structure of claim 1 wherein said contact layer overlies the drain region of a semiconductor device.

7. The semiconductor device structure of claim 1 wherein said second etch rate is approximately 5 times greater than said first etch rate.

8. The semiconductor device structure of claim 1 wherein said first layer of material is comprised of a high density plasma deposited oxide.

9. The semiconductor device structure of claim 1 wherein said second layer of material is comprised of a spin-on-glass material.

10. The semiconductor device structure of claim 1 wherein said second layer of material is comprised of a highly-doped borophosphosilicate glass material.

11. The semiconductor device structure of claim 1 wherein said second layer of material is comprised of an approximately 6 percent-doped borophosphosilicate glass material.

12. A semiconductor device structure for enhancing process margin during an etching process and for preventing deleterious etching of a lightly doped drain spacer oxide and an overlying layer of material upon the etching of an opening wherein said opening at least partially overlies said lightly doped drain spacer oxide and said overlying layer of material, said semiconductor device structure comprising:

a first layer of material disposed above a contact layer, said first layer of material having a first etch rate; and a second layer of material disposed above at least a portion of said first layer of material, said second layer of material having a second etch rate which is approximately 5 times faster than said first etch rate, said first layer of material and said second layer of material having a sloped interfacial topography such that a shaped etch-front is created during said etching of said opening through said first layer of material and said second layer of material, said shaped etch front preventing unwanted etching of portions of said semiconductor device structure during said etching of said opening, said shaped etch front resulting in said opening formed without inducing deleterious etching of said lightly doped drain spacer oxide and said overlying layer of material residing at least partially along the bottom of said opening.

13. The semiconductor device structure of claim 12 wherein said first layer of material is comprised of a high density plasma deposited oxide.

14. The semiconductor device structure of claim 12 wherein said second layer of material is comprised of a spin-on-glass material.

15. The semiconductor device structure of claim 12 wherein said second layer of material is comprised of a highly-doped borophosphosilicate glass material.

16. The semiconductor device structure of claim 12 wherein said second layer of material is comprised of an approximately 6 percent-doped borophosphosilicate glass material.

* * * * *